United States Patent [19]

Nobue et al.

[11] Patent Number: 5,170,129

[45] Date of Patent: Dec. 8, 1992

[54] CHARGE DETECTING CIRCUIT WITH VARIABLE CAPACITOR AND METHOD FOR SAME

[75] Inventors: Mamoru Nobue; Kazuhiro Sakai, both of Kanagawa, Japan

[73] Assignee: Fuji Xerox Co., Ltd., Tokyo, Japan

[21] Appl. No.: 693,589

[22] Filed: Sep. 30, 1991

[30] Foreign Application Priority Data

May 1, 1990 [JP] Japan .................................. 2-111692

[51] Int. Cl.⁵ .......................................... G01R 27/26
[52] U.S. Cl. .................................. 324/678; 358/406; 358/483; 361/281
[58] Field of Search ............... 324/658, 676, 678, 660, 324/661; 358/406, 483; 361/277, 281

[56] References Cited

U.S. PATENT DOCUMENTS

| | | | |
|---|---|---|---|
| 2,870,338 | 1/1959 | Gillson, Jr. | 361/281 X |
| 3,646,413 | 2/1972 | Oomen | 361/281 |
| 3,668,523 | 6/1972 | Kuhn | 324/676 X |
| 3,668,672 | 6/1972 | Parnell | 324/660 |
| 4,636,714 | 1/1987 | Allen | 324/678 |
| 4,831,325 | 5/1989 | Watson, Jr. | 324/678 |

Primary Examiner—Jack B. Harvey
Assistant Examiner—Glenn W. Brown
Attorney, Agent, or Firm—Finnegan, Henderson, Farabow, Garrett and Dunner

[57] ABSTRACT

A method of detecting the charges which photo-electric conversion elements produce in correspondence to the density data of minute regions in an original image. In the method, a variable capacitor is charged with the capacitance set to a large value, and the voltage developed across the variable capacitor is detected with the capacitance set to a small value, whereby the voltage to be detected is increased as much, with an improvement in the signal detection accuracy.

11 Claims, 4 Drawing Sheets

CHARGE DETECTING CIRCUIT WITH VARIABLE CAPACITOR AND METHOD FOR SAME

BACKGROUND OF THE INVENTION

This invention relates to an image reading section in an image reading device which is employed as image reading means in facsimiles, image scanners, etc., and more particularly to a charge detecting method of detecting the charges which photo-electric conversion elements produce in correspondence to the density data of minute regions in an original image, and a charge detecting circuit for practicing the method.

An image reading device set in close contact with an original in order to read the image of the latter comprises: a photo-electric conversion element array made up of a plurality of photo-electric conversion elements arranged in a line; and a drive IC for driving the photo-electric conversion element array. The drive IC includes switches which are adapted to select the photo-electric conversion elements forming the photo-electric conversion element array one after another to apply the charges generated in the photo-electric conversion elements to one output line in a time-sequential manner.

The photo-electric conversion element array has a light receiving section made up of a plurality of photo-electric conversion elements. Each element is formed by arranging a metal electrode and a transparent conductive film on both sides of an amorphous silicon (a-Si) layer, so as to detect optical charges formed by light reflected from an original image.

A simple equivalent circuit for one bit of the image reading device is as shown in FIG. 7. The circuit operates as follows: When a light beam reflected from an original and including data on the density of a small region of the original image is applied to a photo-diode PD, an optical current Ip flows in the photo-diode PD to produce an optical charge therein. The charge thus formed is stored in a capacitor Cp formed by the light receiving element and a capacitor CL formed by wiring (hereinafter referred to as "a wiring capacitor CL", when applicable), so that the voltage Va of an input line of an amplifier A is increased. The amplifier A detects the voltage Va with high input impedance. The output of the amplifier A is applied by means of an analog switch SW to an output line $T_{out}$ for every bit, to form a time-series signal. Thereafter, the amplifier A is reset; more specifically, the input line of the amplifier A is grounded through a reset switch RS. Therefore, as the wiring capacitor CL decreases, the voltage Va of the input line of the amplifier A is increased, and accordingly the signal detection accuracy is increased.

The above-described image reading device is disadvantageous in that, since a number of photo-electric conversion elements 70 are driven individually, it is necessary to use a number of driving ICs with the result that the manufacturing cost is increased as much. In order to overcome this difficulty, a matrix drive type image reading device has been proposed in the art which is lower in manufacturing cost with the number of driving ICs decreased.

The matrix drive type image reading device, as shown in FIG. 8, comprises: K photo-electric conversion element groups each consisting of n photo-electric conversion elements 70; and switching elements $T_{11}$–$T_{kn}$ which are provided for the photo-electric conversion elements 70, respectively. The switching elements $T_{11}$–$T_{kn}$ are connected to n common signal lines 80. For every block, the switching elements $T_{11}$–$T_{kn}$ are turned on by gate pulses applied to gate lines G1–Gk, so that several bits are connected to the common signal lines at the same time, thus being processed in a parallel mode.

For simplification in description, the operation of the image reading device will be described with reference only to the first block. It is assumed that, when the switching elements $T_{11}$–$T_{1n}$ are turned off, a light beam reflected from an original which includes data on a small region of the original image is applied to the image reading device. In this case, in response to the light beam, optical currents Ip flow, thus producing optical charges. The charges thus produced are stored in the light receiving element capacitors $C_{Pl1}$–$C_{Pln}$ and in the overlap capacitors $C_{GD}$ between the drains and gates of the switching elements. When the switching elements $T_{11}$–$T_{1n}$ are turned on, the aforementioned charges are distributed to the overlap capacitors $C_{GS}$ between the sources and gates of the switching elements, the wiring capacitors $C_{L1}$–$C_{Ln}$, the light receiving element capacitors $C_{Pl1}$–$C_{Pln}$, and the overlap capacitors $C_{GD}$. Therefore, in order to sufficiently transfer the charge to the wiring capacitors $C_L$, the capacitance must be much larger than the light receiving capacitance $C_P$, and the overlap capacitances $C_{GS}$ and $C_{GD}$. The changes in potential of the common signal lines 80 due to the charges stored in the wiring capacitors $C_{L1}$–$C_{Ln}$ are transmitted through amplifiers $A_1$–$A_n$ to an output line $T_{out}$ by closing analog switches $SW_1$–$SW_n$ in a driving IC 81 one after another, so that they are detected in a time-sequential manner. The above-described operation is carried out for every block, so that an image signal is formed for one line of the original.

In the image reading device described with reference to FIG. 7 which employs the potential detecting method, the signal detection accuracy is increased with the decreased capacitance of the wiring capacitor, as was described before; however, it is impossible to decrease the capacitance because of the following reason: In order to allow an optical current to flow in the photo-diode PD, the reverse bias voltage VB across the photo-diode PD must be sufficiently high. If the wiring capacitor CL is small in capacitance, then the reverse bias voltage VB is decreased as the voltage across the wiring capacitor CL increases. If the effective reverse bias voltage VB of the photo-diode PD decreases in this manner, then it becomes impossible to supply the optical current. However, it should be noted that the voltage across the wiring capacitor can be increased as the capacitance of the wiring capacitor decreases as long as the reverse bias voltage VB does not adversely affect the optical current.

In the image reading device of matrix drive type described with reference to FIG. 8, the charges are transferred through the switching elements $T_{kn}$ to the wiring capacitors $C_L$ and stored therein. Hence, in order to improve the charge transferring efficiency, it is necessary to make $C_L$ much larger than ($C_P + C_{GD}$). For this purpose, it is necessary to reduce the voltage developed across the wiring capacitor $C_L$ to a small fraction of that provided on the side of the photo-electric conversion element 70. Hence, the voltage is amplified in the driving IC 81, thus increasing the sensitivity. In this operation, offset noises or random noises occur with the driving IC 81, thus lowering the S/N ratio.

SUMMARY OF THE INVENTION

Accordingly, an object of this invention is to eliminate the above-described difficulties accompanying a conventional image reading device.

More specifically, an object of the invention is to provide a charge detecting method in which a voltage detecting capacitor is made variable in capacitance, to increase an effective detection voltage thereby to improve the signal detection accuracy, and a charge detecting circuit for practicing the method.

A charge detecting method according to the invention comprises the steps of setting a variable capacitor to a predetermined capacitance, injecting a charge into the variable capacitor, changing only the capacitance of the variable capacitor with the charge maintained in the variable capacitor, and detecting a voltage developed across the variable capacitor.

Further, a charge detecting circuit according to the invention comprises a variable capacitor whose capacitance is changed by external means, injecting means for injecting a charge into the variable capacitor, and detecting means for detecting a voltage developed across the variable capacitor.

DETAILED DESCRIPTION OF THE PREFERRED EMBODIMENTS

Preferred embodiments of this invention will be described with reference to the accompanying drawings.

First, a matrix drive type image reading device which constitutes a first embodiment of the invention, will be described with reference to FIG. 1.

Figure 1:
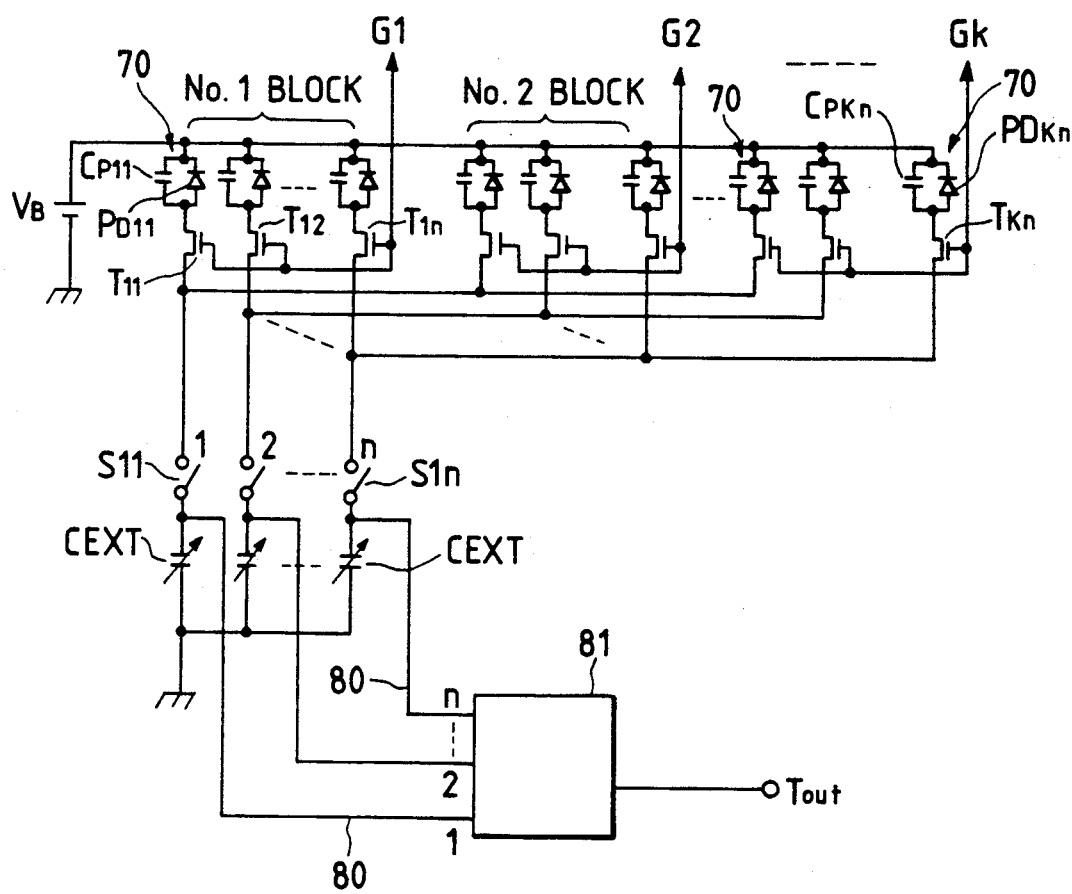
FIG. 1 is an equivalent circuit diagram, partly as a block diagram, showing an example of an image reading device which constitutes a first embodiment of the invention.
Figure 8:
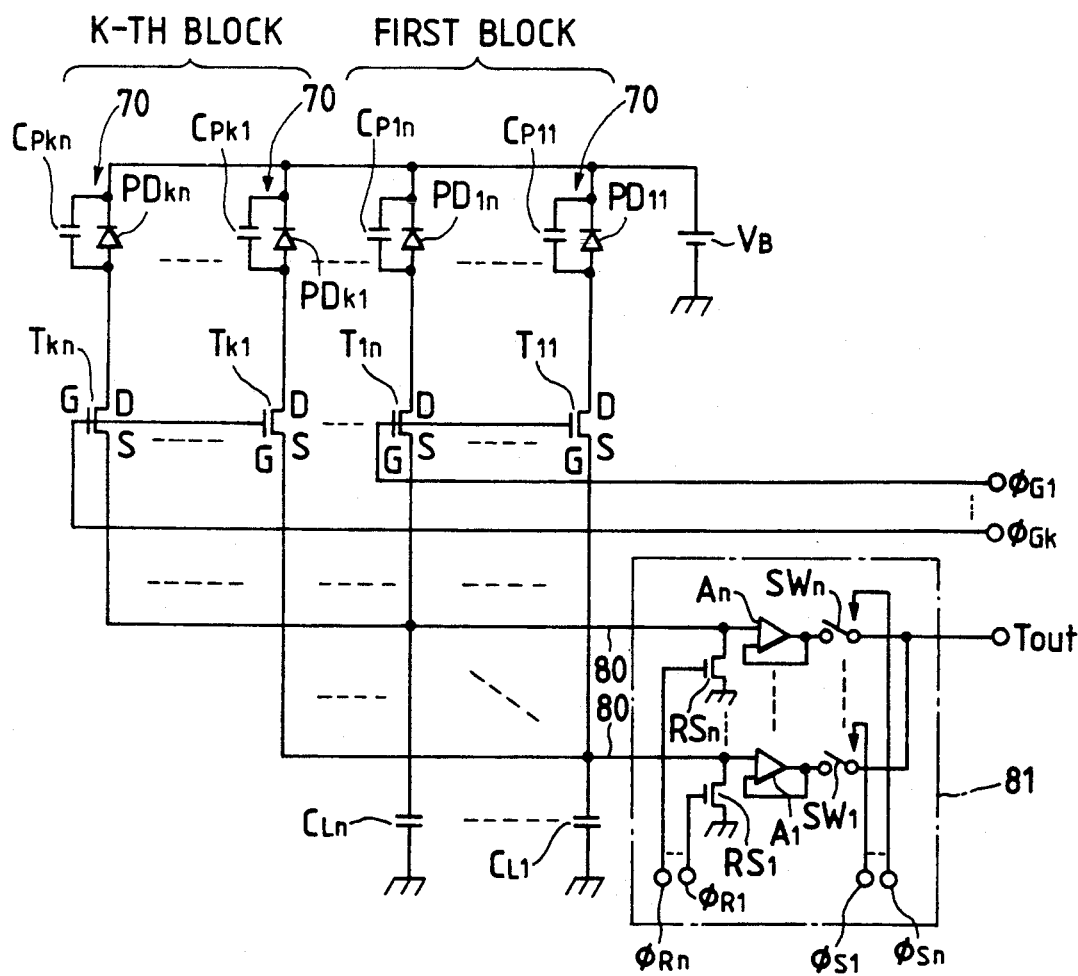

As shown in FIG. 1, a photo-electric conversion element array is made up of a plurality of photo-electric conversion elements 70 corresponding to bits, and the photo-electric conversion elements 70 are connected through switches Sll-Sln to variable capacitors CEXT. In FIG. 1, parts corresponding functionally to those which have been described with reference to FIG. 8 are accordingly designated by the same reference numerals or characters.

The switches Sll-Sln are made up of thin film transistors, and the variable capacitors CEXT are of a lamination structure. The switches and the variable capacitors are formed in the same manufacturing process as the photo-electric conversion elements 70 and the switching elements $T_{kn}$.

Figure 2:
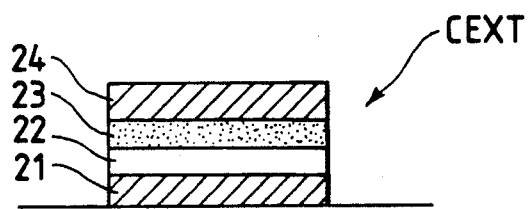
FIG. 2 is an explanatory diagram for a description of the structure of a variable capacitor shown in FIG. 1.

Each of the variable capacitors CEXT is so designed as to change its capacitance into two values in response to external signals. The structure of each variable capacitor CEXT will be described with reference to FIG. 2. As shown in FIG. 2, the variable capacitor is formed by laying a metal electrode 21, an insulating layer 22, a semiconductor layer 23, and a metal electrode 24 one on another in the stated order. A pulse voltage is applied to the metal electrode 21. Examples of the material of the metal electrodes 21 and 24 are metals such as Au, Cr, Mo, Ti and Ta which are low in resistance and which are stable with temperature and chemicals so that they are not deteriorated during photolithographing in the formation of the capacitor; or Oxide conductors such as $SnO_2$ and ITO. The insulation layer 22 is made of an oxide or nitride such as $SiN_x$, $SiO_x$, $TaO_x$ and $TaON_x$. The semiconductor layer 23 is made of p-type or n-type semiconductor which is formed by doping impurities into amorphous silicon, or amorphous silicon semiconductor including germanium or carbide.

When a voltage higher than that at the metal electrode 24 (for instance +5 V) is applied to the metal electrode 21, an electron storage layer is formed in the interface of the insulating layer 22 and the semiconductor layer 23, as a result of which, in the variable capacitor, the region from the metal electrode 24 up to the interface becomes low in resistance. Therefore, the capacitance between the metal electrodes 21 and 24 may be represented by C1 corresponding to the thickness of the insulating layer 22. When, on the other hand, a voltage lower than that at the metal electrode 24 (for instance −5 V) is applied to the metal electrode 21, the depletion of electron occurs on the semiconductor side of the interface of the insulating layer 22 and the semiconductor layer 23, thus providing high resistance. When the depletion has advanced sufficiently, the capacitance between the metal electrodes 21 and 24 becomes C2 corresponding to the serial connection of the insulating layer 22 and the semiconductor layer 23. The capacitance C2 is smaller than the capacitance C1. Therefore, the capacitance of the variable capacitor CEXT can be changed with the potential of the metal electrode 21.

Each of the switches Sll to Sln is so provided that, when each variable capacitor CEXT is decreased in capacitance, the charge transferred to the CEXT may not be redistributed to the overlap capacitors $C_{GS}$ formed between the gates and sources of the respective switching elements ($T_{kn}$). That is, it is used to electrically disconnect the variable capacitor CEXT from the switching elements ($T_{kn}$), thereby to allow the variable capacitor to change in capacitance with the charge maintained therein.

Figure 3:
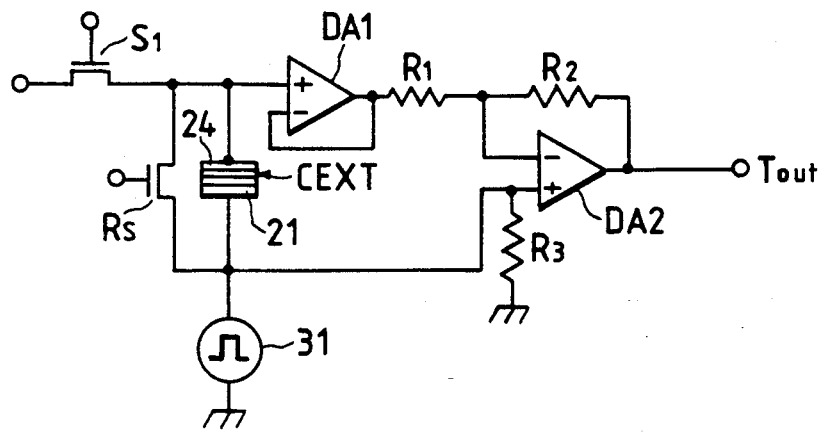
FIG. 3 is an equivalent circuit diagram showing one bit in the image reading device shown in FIG. 1.

FIG. 3 shows the arrangement of a detecting circuit with the variable capacitor CEXT in detail.

The detecting circuit comprises: the variable capacitor CEXT; a voltage circuit 31 connected to the metal electrode 21 of the variable capacitor CEXT, to control the potential of the metal electrode 21; a reset switch RS connected between the metal electrodes 21 and 24, to reset the variable capacitor CEXT; i.e., to discharge the latter; an equimagnification amplifier DA1 one input terminal of which is connected to the metal electrode 24 of the variable capacitor CEXT; a differential amplifier DA2 for amplifying the potential difference between the output terminal of the amplifier DA1 and the metal electrode 21 of the variable capacitor CEXT; and the above-described switch S1. The charge stored in the variable capacitor CEXT changes the voltage across it in accordance with the capacitance of the capacitor CEXT. In order to eliminate the change in potential of the metal electrode 21, the voltage across the capacitor CEXT is detected through the differential amplifier DA2.

Figure 4:
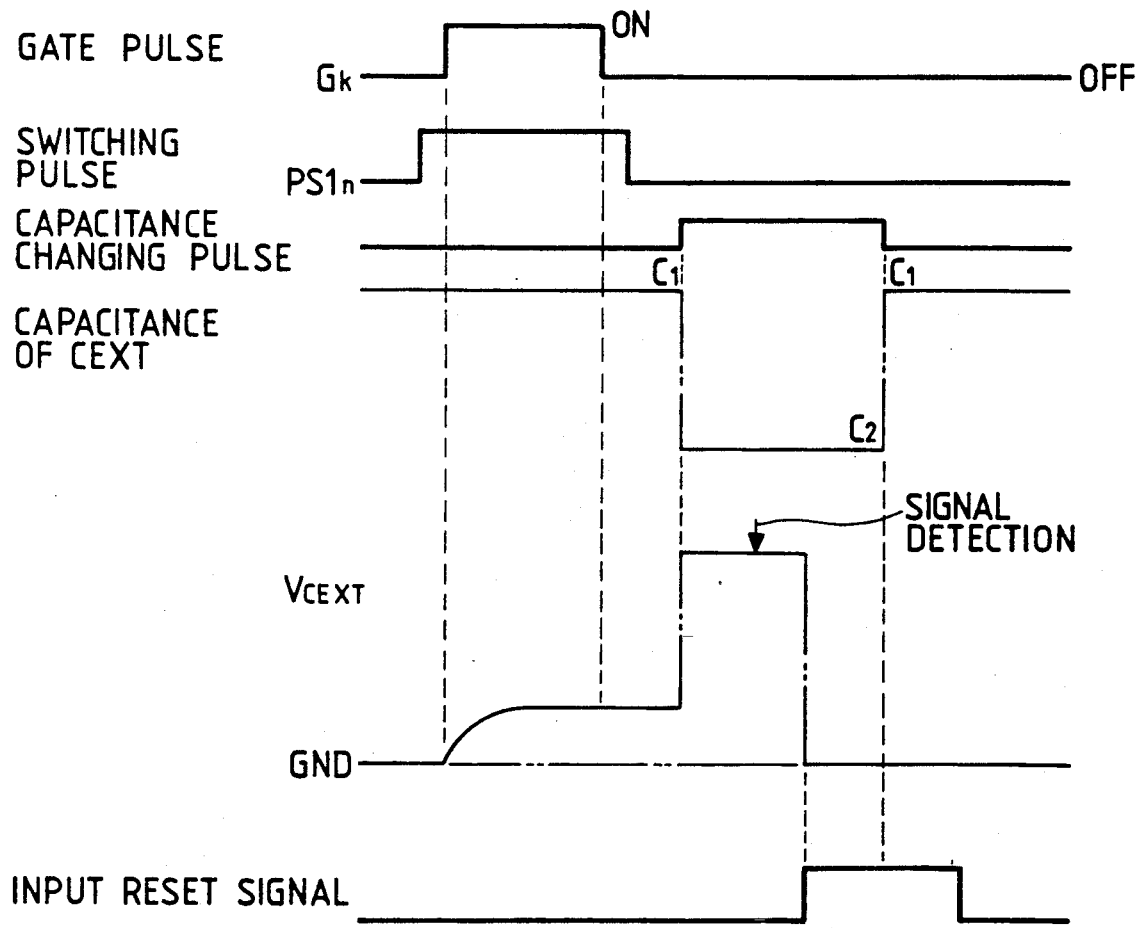
FIG. 4 is a timing chart showing signals for the one bit in the image reading device shown in FIGS. 1 and 3.

The operation of the detecting circuit shown in FIGS. 1 and 3 will be described with reference to FIG. 4, which is a timing chart corresponding to one bit for a photo-electric conversion element.

In response to a gate pulse (Gk) and a switching pulse (PSln) for the switch (Sln), the switching element ($T_{kn}$) and the switch (Sln) are turned on so that the photo-electric conversion element 70 is connected to the variable capacitor CEXT. The switching pulse (PSln) is made larger in pulse width than the gate pulse (Gk) so that the switch (Sln) is closed when the switching element ($T_{kn}$) is closed.

When the switching element ($T_{kn}$) is turned on by the gate pulse (Gk), the charge is transferred into the variable capacitor CEXT the capacitance of which has been increased to C1.

Thereafter, the switch (Sln) is opened so that the photo-electric conversion element 70 is electrically disconnected from the variable capacitor CEXT. Under this condition, a capacitance changing pulse is applied to the metal electrode 21 of the variable capacitor CEXT to change the capacitance of the latter into C2 (C2<C1). The variable capacitor CEXT has been electrically disconnected from the switching element ($T_{kn}$) as was described above. Therefore, the charge will not be distributed to the overlap capacitor $C_{GS}$ of the switching element ($T_{kn}$), and accordingly, the variable capacitor CEXT can be changed in capacitance and in voltage with the charge maintained unchanged. The changed voltage ($V_{CEXT}$) across the variable capacitor CEXT is detected by the differential amplifier DA2. Therefore, the variable capacitor CEXT are discharged by the input reset signal (Rs).

Figure 5:
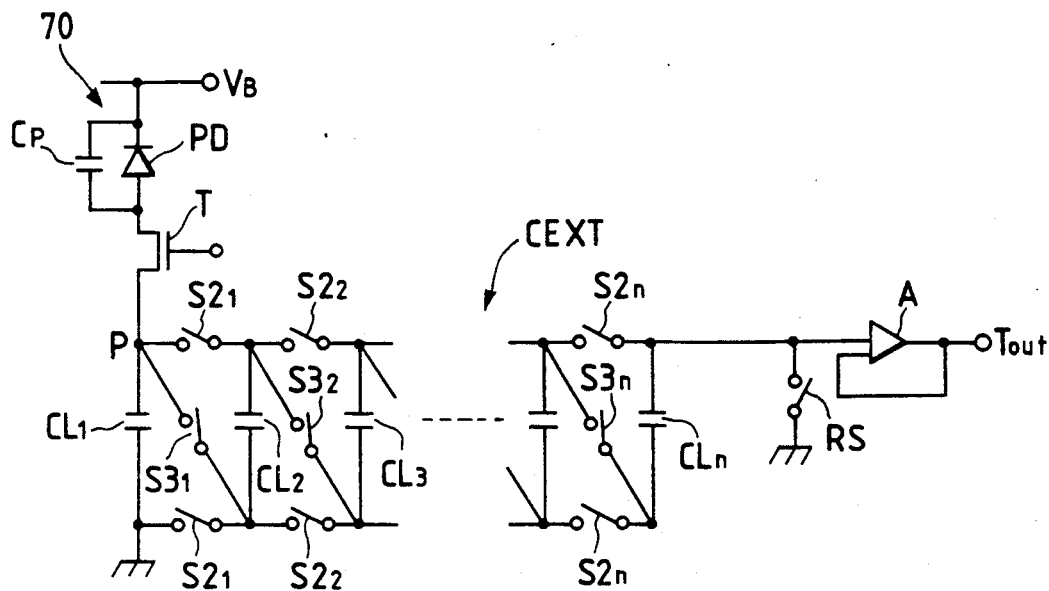
FIG. 5 is an equivalent circuit diagram showing one bit in another example of the image reading device which constitutes a second embodiment of the invention.

FIG. 5 is an equivalent circuit showing one bit in a matrix drive type image reading device, which constitutes a second embodiment of the invention. In FIG. 5, parts corresponding functionally to those which have been described with reference to FIG. 8 are therefore designated by the same reference numerals or characters.

In the image reading device, for each bit including a photo-electric conversion element 70, a variable capacitor CEXT is provided which is made up of a number (n) of capacitors $CL_l$-$CL_n$. The terminals of the capacitors $CL_l$-$CL_n$ are connected through a plurality of switches $S2_l$-$S2_n$ as shown in FIG. 5 so that the capacitors can be connected in parallel to one another through the switches. Furthermore, the terminals of the capacitors $CL_l$-$CL_n$ are connected through a plurality of switches $S3_l$-$S3_n$ as shown in FIG. 5, so that the capacitors are connected in series to one another. That is, the capacitors $CL_l$-$CL_n$ are connected in parallel to one another by closing the switches $S2_l$-$S2_n$, and are connected in series to one another by closing the switches $S3_l$-$S3_n$. More specifically, the capacitance of the variable capacitor CEXT comprising the capacitors $CL_l$-$CL_n$ can be changed into two values by operating those switches. A switching element T provided for the photo-electric conversion element 70 is connected to the end capacitor $CL_l$, so that, when the parallel connection is switched over to the series connection, the potential at the terminal P is prevented from being changed; that is, the transfer of charge to the switching element is prevented.

The variable capacitors CEXT are contained in the IC chip; however, the invention is not limited thereto or thereby.

Figure 6:
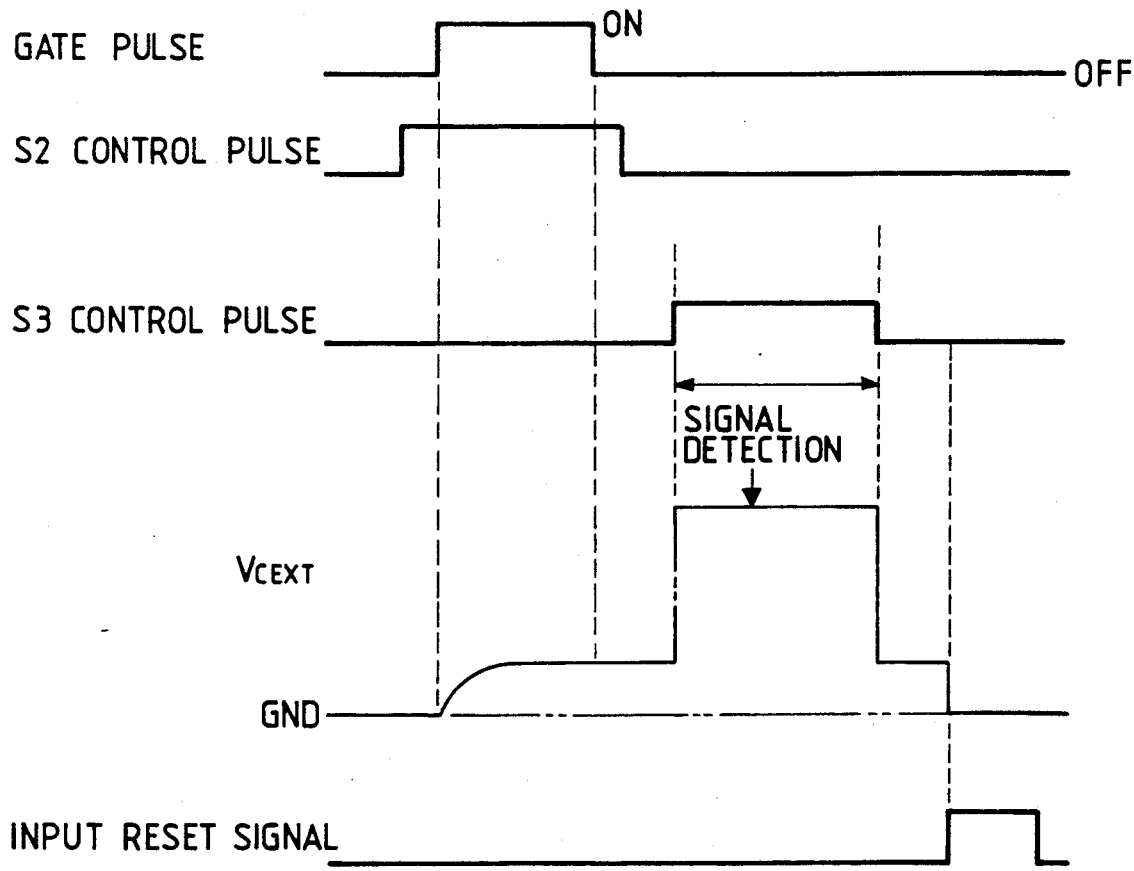
FIG. 6 is a timing chart showing signals for the one bit in the image reading device shown in FIG. 5.
Figure 7:
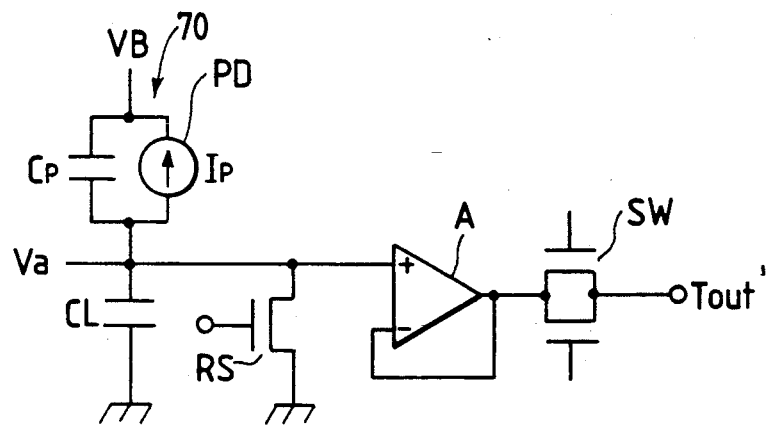
FIGS. 7 and 8 are equivalent circuit diagrams showing examples of a conventional image reading device.

The operation of the detecting circuit shown in FIG. 5 will be described with reference to FIG. 6, which is a timing chart corresponding to one bit for the photo-electric conversion element 70.

In response to an S2 control pulse, the switches $S2_l$-$S2_n$ are closed so that the capacitors $CL_l$-$CL_n$ forming the variable capacitor CEXT are connected in parallel to one another. Assuming that all the capacitors have a capacitance C, the resultant capacitance of the capacitor CEXT is (n×C).

When the switching element T is closed in response to a gate pulse, the charge is transferred from the photo-electric conversion element 70 to the variable capacitor CEXT whose capacitance is (n×C), to saturate the capacitor.

When the switches $S3_l$-$S3_n$ are closed by an S3 control pulse, the capacitors $CL_l$-$CL_n$ forming the variable capacitor CEXT are connected in series to one another, so that the capacitance of the variable capacitor CEXT is set to (C/n). In this case, the charges are redistributed in the capacitors $CL_l$-$CL_n$; however, since the switching element T is connected to the end capacitor $CL_l$, the voltage across the capacitor CL is maintained unchanged, and accordingly the charge is not returned to the switching element T. Hence, in the second embodiment, unlike the first embodiment shown in FIG. 1, it is unnecessary to provide the switches (Sl1-Sln in FIG. 1) for electrically disconnecting the switching elements T from the variable capacitors CEXT.

That is, in the second embodiment, the capacitance of the variable capacitor CEXT can be changed with the charge maintained therein. When the capacitance of the variable capacitor CEXT is changed in this manner, the voltage applied to the amplifier A is changed, and the voltage thus changed is detected as a detection signal.

The residual charge in the variable capacitor CEXT is removed by application of the input reset signal.

In the second embodiment, the switches $S2_l$-$S2_n$ and $S3_1$-$S3_n$ and the variable capacitors CEXT including a number of capacitors $CL_l$-$CL_n$ are formed in an IC chip, which is used to form the image reading device. Therefore, the image reading device is simple in the film manufacturing process, and is high in manufacture yield.

As apparent from the foregoing description, according to the invention, a variable capacitor is charged with the capacitance set to a large value, and the voltage developed across the variable capacitor is detected with the capacitance set to a small value. Hence, when the signal detection is not carried out, the capacitance of the variable capacitor is increased, so that the variable capacitor functions as a low impedance element which causes no voltage change; and when the signal detection is carried out, the capacitance is decreased, so that the voltage to be detected is increased; that is, the S/N ratio is increased, thus improving the sensitivity.

What is claimed is:

1. A charge detecting circuit comprising:
   a variable capacitor having a capacitance adapted to be changeable by external means, wherein said variable capacitor comprises a plurality of capacitors, said plurality of capacitors being alternately connected to one another in series or in parallel to change said capacitance of said variable capacitor;

injecting means for injecting a charge into said variable capacitor; and detecting means for detecting a voltage developed across said variable capacitor.

2. A charge detecting circuit as claimed in claim 1, wherein the capacitance of said variable capacitor is changed by an external voltage.

3. A charge detecting circuit as claimed in claim 1, wherein said injecting means is connected through a switching element to a charge generating source.

4. A charge detecting circuit as claimed in claim 1, wherein said detecting means is a differential amplifier.

5. A charge detecting circuit as claimed in claim 1, wherein said variable capacitor is formed by laying a first conductor layer, an insulating layer, a semiconductor layer, and a second conductor layer one on another in the stated order.

6. A charge detecting circuit as claimed in claim 1, wherein upon series connection of said plurality of capacitors to one another, a first terminal of a first one of said plurality of capacitors is connected to ground and a second terminal of said first one of said plurality of capacitors is connected to said injecting means.

7. A charge detecting method comprising the steps of:

setting a variable capacitor to a predetermined capacitance, said variable capacitor comprising a plurality of individual capacitors;

establishing a charge on said variable capacitor;

alternately connecting said plurality of individual capacitors in series or in parallel to change said predetermined capacitance of said variable capacitor while maintaining said charge on the variable capacitor;

detecting a voltage developed across the variable capacitor.

8. An image reading device, comprising:

a plurality of photoelectric conversion elements arranged in an array, each photoelectric conversion element producing an optical charge in response to light reflected from an image;

a plurality of variable capacitors, each one of said plurality of variable capacitors having a capacitance and storing the optical charge of a respective photoelectric conversion element;

means for changing said capacitance of each one of said plurality of variable capacitors while maintaining the stored optical charge; and means for detecting a voltage developed across each one of said plurality of variable capacitors.

9. The image reading device of claim 8, wherein the means for changing includes a plurality of switches, each of said switches being interposed between a respective photoelectric conversion element and a corresponding variable capacitor.

10. The image reading device of claim 8, wherein the means for changing includes means for changing an external voltage applied to each of said variable capacitors.

11. The image reading device of claim 8, wherein the means for detecting includes a differential amplifier.

* * * * *